United States Patent
Tai et al.

(10) Patent No.: US 10,796,139 B2
(45) Date of Patent: Oct. 6, 2020

(54) GESTURE RECOGNITION METHOD AND SYSTEM USING SIAMESE NEURAL NETWORK

(71) Applicant: KaiKuTek Inc., Taipei (TW)

(72) Inventors: Tsung-Ming Tai, New Taipei (TW);
Yun-Jie Jhang, Taoyuan (TW);
Wen-Jyi Hwang, Taipei (TW);
Chun-Hsuan Kuo, San Diego, CA (US)

(73) Assignee: KAIKUTEK INC., Taipei (TW)

( * ) Notice: Subject to any disclaimer, the term of this patent is extended or adjusted under 35 U.S.C. 154(b) by 177 days.

(21) Appl. No.: 16/121,008

(22) Filed: Sep. 4, 2018

(65) Prior Publication Data

US 2019/0244017 A1    Aug. 8, 2019

Related U.S. Application Data

(60) Provisional application No. 62/626,147, filed on Feb. 4, 2018.

(51) Int. Cl.
*G06K 9/00* (2006.01)
*G06K 9/62* (2006.01)
(Continued)

(52) U.S. Cl.
CPC .......... *G06K 9/00335* (2013.01); *G01S 7/414* (2013.01); *G01S 7/417* (2013.01); *G01S 13/584* (2013.01); *G01S 13/89* (2013.01); *G06F 3/017* (2013.01); *G06F 9/5027* (2013.01); *G06F 17/18* (2013.01); *G06K 9/2018* (2013.01); *G06K 9/4628* (2013.01); *G06K 9/6215* (2013.01); *G06K 9/6256* (2013.01); *G06K 9/6259* (2013.01); *G06K 9/6262* (2013.01); *G06K 9/6267* (2013.01); *G06K 9/6271* (2013.01); *G06N 3/08* (2013.01); *G06N 20/00* (2019.01);
(Continued)

(58) Field of Classification Search
None
See application file for complete search history.

(56) References Cited

U.S. PATENT DOCUMENTS

2015/0100530 A1* 4/2015 Mnih ............... G06N 20/00 706/25
2019/0087009 A1* 3/2019 Rao ................ G06F 3/167
(Continued)

*Primary Examiner* — Iman K Kholdebarin
(74) *Attorney, Agent, or Firm* — Birch, Stewart, Kolasch & Birch, LLP

(57) ABSTRACT

A gesture recognition system using siamese neural network executes a gesture recognition method. The gesture recognition method includes steps of: receiving a first training signal to calculate a first feature; receiving a second training signal to calculate a second feature; determining a distance between the first feature and the second feature in a feature space; adjusting the distance between the first feature and the second feature in feature space according to a predetermined parameter. Two neural networks are used to generate the first feature and the second feature, and determine the distance between the first feature and the second feature in the feature space for training the neural networks. Therefore, the gesture recognition system does not need a big amount of data to train one neural network for classifying a sensing signal. A user may easily define a new personalized gesture.

12 Claims, 5 Drawing Sheets

(51) Int. Cl.
  *G01S 13/89*  (2006.01)
  *G01S 7/41*  (2006.01)
  *G06K 9/20*  (2006.01)
  *G06K 9/46*  (2006.01)
  *G06N 20/00*  (2019.01)
  *G06F 3/01*  (2006.01)
  *G06F 9/50*  (2006.01)
  *G06N 3/08*  (2006.01)
  *H03B 21/02*  (2006.01)
  *G01S 13/58*  (2006.01)
  *G06T 7/20*  (2017.01)
  *G06F 17/18*  (2006.01)
  *G01S 13/50*  (2006.01)
  *G01S 7/35*  (2006.01)

(52) U.S. Cl.
  CPC .............. *G06T 7/20* (2013.01); *H03B 21/02* (2013.01); *G01S 7/415* (2013.01); *G01S 13/50* (2013.01); *G01S 2007/356* (2013.01); *G06T 2207/10028* (2013.01); *G06T 2207/20056* (2013.01); *G06T 2207/20081* (2013.01); *G06T 2207/20084* (2013.01)

(56) References Cited

U.S. PATENT DOCUMENTS

| | | | |
|---|---|---|---|
| 2019/0258925 A1* | 8/2019 | Li | G06F 16/583 |
| 2019/0279087 A1* | 9/2019 | Uchida | G06K 9/6271 |
| 2019/0295240 A1* | 9/2019 | Doutre | G06K 9/00228 |
| 2019/0347553 A1* | 11/2019 | Lo | G06N 3/063 |
| 2020/0043504 A1* | 2/2020 | Li | G10L 17/02 |

* cited by examiner

GESTURE RECOGNITION METHOD AND SYSTEM USING SIAMESE NEURAL NETWORK

BACKGROUND OF THE INVENTION

1. Field of the Invention

The present invention relates to a recognition method and a recognition system, and more particularly to a gesture recognition method and a gesture recognition system using siamese neural network.

2. Description of the Related Art

Recognition systems generally receive sensing signals from a sensor to recognize the motion of the user by using a neural network. For example, the recognition system receives sensing signals from the sensor, processes the sensing signals using the neural network, and utilizes the recognition system to determine whether a user being observed by the sensor is using portions of his or her body to do particular actions or form particular shapes, or gestures. Then, the recognition system classifies the motion of the user, and associates the motion of the user with executable commands or instructions.

However, the neural network needs a big amount of training data to ensure accuracy of a recognition result of the recognition system. When a user wants to define a personalized gesture, the user needs to do a particular action for many times to train the neural network of the recognition system. It is very inconvenient for the user to define the personalized gesture by him.

Therefore, the recognition system needs to be further improved.

SUMMARY OF THE INVENTION

An objective of the present invention is to provide a gesture recognition method and a gesture recognition system using siamese neural network. The present invention may train a neural network of a recognition system by a few training data. Therefore, the user may easily define a personalized gesture.

The gesture recognition method using siamese neural network comprises steps of:

controlling weight of a first neural network unit and weight of a second neural network unit to be the same by a weight sharing unit;

receiving a first training signal from a sensor to calculate a first feature by the first neural network unit;

receiving a second training signal from the sensor to calculate a second feature by the second neural network unit;

determining a distance between the first feature and the second feature in a feature space by a similarity analysis unit;

controlling the weight of the first neural network unit and the weight of the second neural network unit through the weight sharing unit to adjust the distance between the first feature and the second feature in a feature space according to a predetermined parameter by a weight controlling unit.

The gesture recognition system using siamese neural network comprises a sensor, a first neural network unit, a second neural network unit, a weight sharing unit, a similarity analysis unit, and a weight controlling unit.

The sensor senses a first training signal and a second training signal.

The first neural network unit is electrically connected to the sensor to receive the first training signal, and calculates a first feature. The second neural network unit is electrically connected to the sensor to receive the second training signal, and calculates a second feature.

The weight sharing unit is electrically connected to the first neural network unit and the second neural network unit, and controls weight of the first neural network unit and weight of the second neural network unit to be the same.

The similarity analysis unit is electrically connected to the first neural network unit and the second neural network unit, and receives the first feature and the second feature. The similarity analysis unit determines a distance between the first feature and the second feature in a feature space.

The weight controlling unit is electrically connected to the similarity analysis unit and the weight sharing unit. The weight controlling unit controls the weight of the first neural network unit and the weight of the second neural network unit through the weight sharing unit to adjust the distance between the first feature and the second feature in the feature space according to a predetermined parameter.

The present invention can use two neural networks to generate two features, and can determine the distance between the first feature and the second feature in the feature space for training the first neural network unit and the second neural network unit. Therefore, the present invention does not need a big amount of data to train one neural network for classifying a sensing signal. The user may easily define a new personalized gesture.

DETAILED DESCRIPTION OF THE INVENTION

Figure 1:
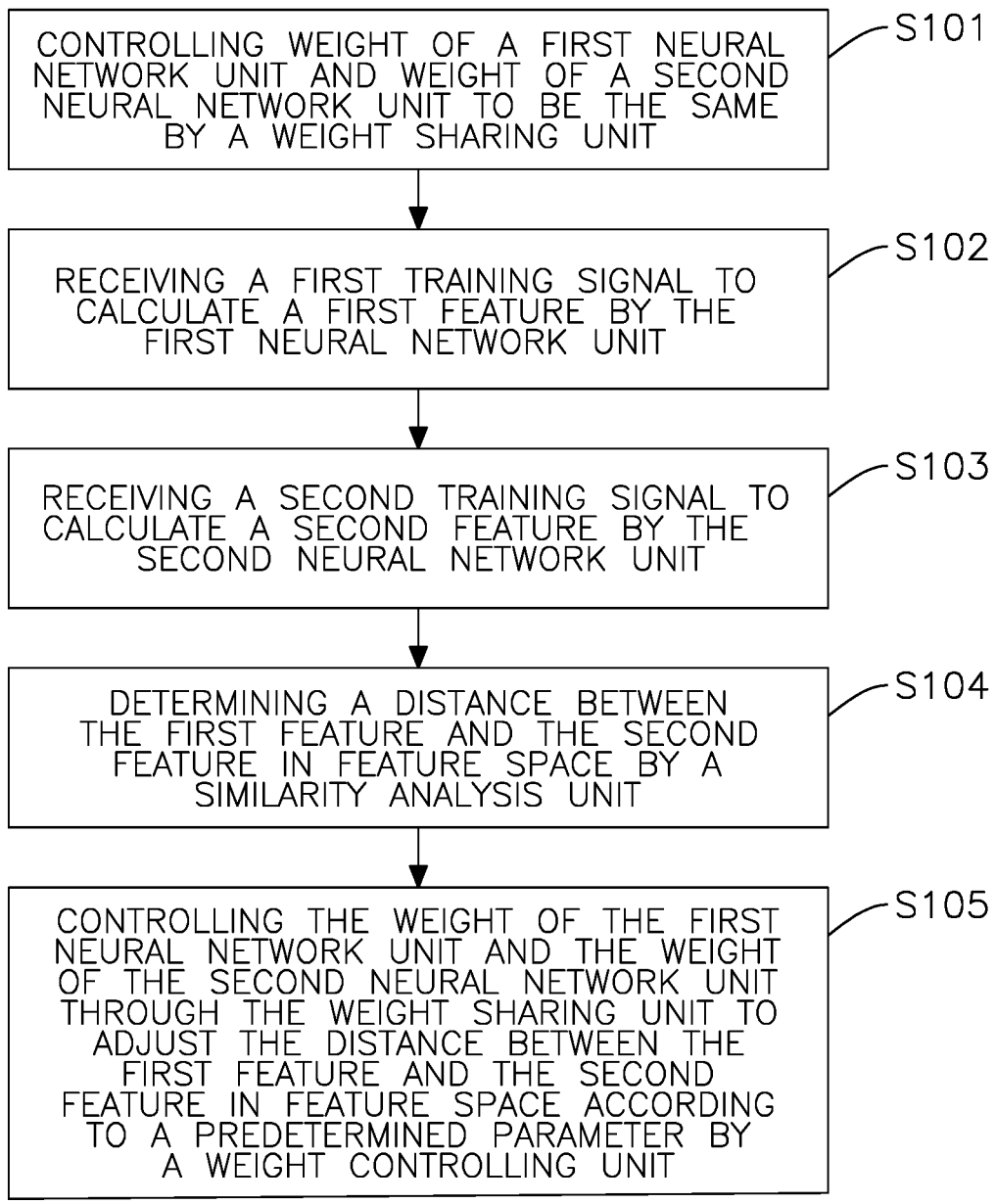
FIG. 1 is a flowchart of a first embodiment of a gesture recognition method using siamese neural network of the present invention.

With reference to FIG. 1, the present invention relates to a gesture recognition method and a gesture recognition system using siamese neural network. The gesture recognition method includes steps of:

controlling weight of a first neural network unit and weight of a second neural network unit to be the same by a weight sharing unit (S101);

receiving a first training signal from a sensor to calculate a first feature by the first neural network unit (S102);

receiving a second training signal from the sensor to calculate a second feature by the second neural network unit (S103);

determining a distance between the first feature and the second feature in a feature space by a similarity analysis unit (S104);

controlling the weight of the first neural network unit and the weight of the second neural network unit through the weight sharing unit to adjust the distance between the first feature and the second feature in the feature space according to a predetermined parameter by a weight controlling unit (S105).

Figure 2:
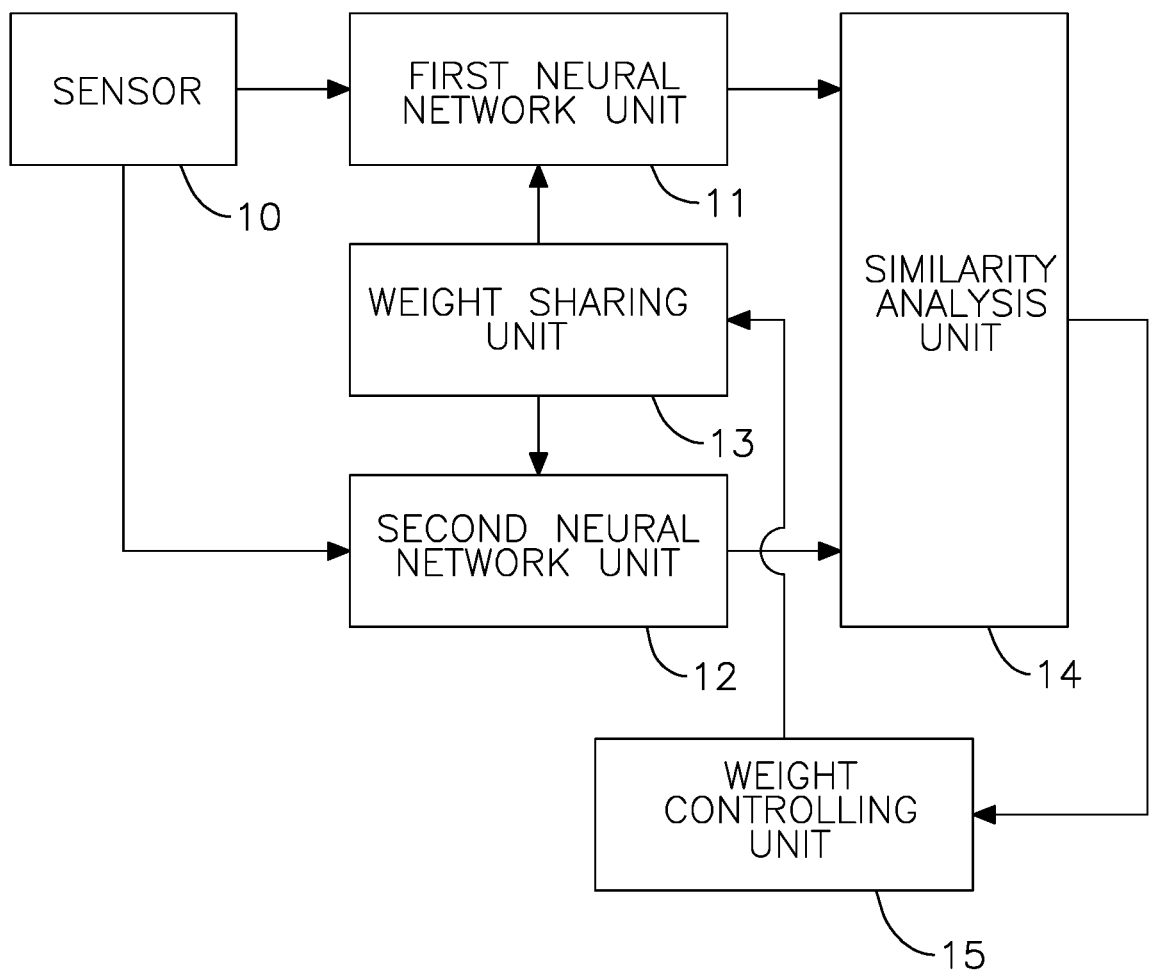
FIG. 2 is a block diagram of a first embodiment of a gesture recognition system using siamese neural network of the present invention.

With reference to FIG. 2, the gesture recognition system using siamese neural network includes a sensor 10, a first neural network unit 11, a second neural network unit 12, a weight sharing unit 13, a similarity analysis unit 14, and a weight controlling unit 15.

The sensor 10 senses the first training signal and the second training signal. The first neural network unit 11 is electrically connected to the sensor 10 to receive the first training signal, and the first neural network unit 11 calculates the first feature according to the first training signal.

The second neural network unit 12 is electrically connected to the sensor 10 to receive the second training signal, and the second neural network unit 12 calculates the second feature according to the second training signal.

The weight sharing unit 13 is electrically connected to the first neural network unit 11 and the second neural network unit 12, and the weight sharing unit 13 controls the weight of the first neural network unit 11 and the weight of the second neural network unit 12 to be the same.

The similarity analysis unit 14 is electrically connected to the first neural network unit 11 and the second neural network unit 12, and the similarity analysis unit 14 receives the first feature and the second feature. The similarity analysis unit 14 determines a distance between the first feature and the second feature in the feature space.

The weight controlling unit 15 is electrically connected to the similarity analysis unit 14 and the weight sharing unit 13. The weight controlling unit 15 controls the weight of the first neural network unit and the weight of the second neural network unit through the weight sharing unit 13 to adjust the distance between the first feature and the second feature in the feature space according to a predetermined parameter.

The present invention can use two neural networks to generate two features, and can determine a similarity between the two features for training the first neural network unit and the second neural network unit. Therefore, the present invention does not need a big amount of data to train one neural network for classifying a sensing signal, and the user may easily define a new personalized gesture.

For example, when the user wants to define a new personalized gesture, the user may perform the personalized gesture at least one time. The sensor 10 may sense the personalized gesture to generate the first training signal. The first neural network unit 11 may generate the first feature according to the first training signal. Then, the first feature may be stored in a database as a reference anchor sample for further classification.

Moreover, the user may perform another personalized gesture at least one time. The sensor 10 may sense said another personalized gesture to generate the second training signal. The second neural network unit 11 may generate the second feature according to the second training signal. Then, the similarity analysis unit 14 may load the first feature stored in the database and receive the second feature to calculate the distance between the first feature and the second feature in the feature space. The similarity analysis unit 14 may load the first feature stored in the database and receive the second feature to calculate the distance between the first feature and the second feature in the feature space. Then, the weight controlling unit 15 controls the weight of the first neural network unit 11 and the weight of the second neural network unit 12 for training the first neural network unit 11 and the second neural network unit 12 according to the predetermined parameter.

Figure 3:
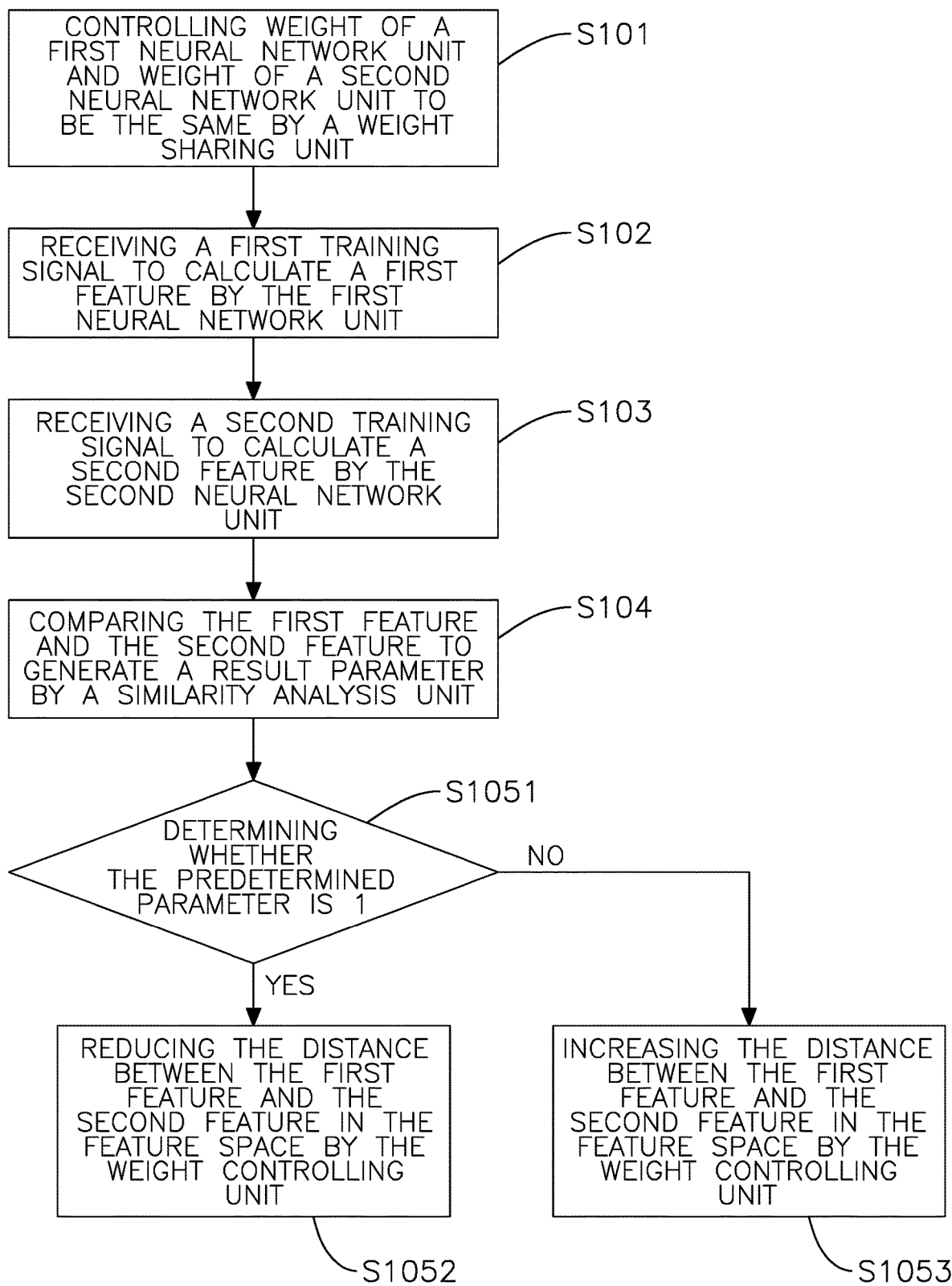
FIG. 3 is a flowchart of a second embodiment of a gesture recognition method using the siamese neural network of the present invention.

Further, with reference to FIG. 3, in the step S105 of the gesture recognition method, the weight controlling unit controls the weight of the first neural network unit and the weight of the second neural network unit according to the step of:

determining whether the predetermined parameter is 1 (S1051); when the predetermined parameter is 1, reducing the distance between the first feature and the second feature in the feature space by the weight controlling unit 15 (S1052);

when the predetermined parameter is 0, increasing the distance between the first feature and the second feature in the feature space by the weight controlling unit 15 (S1053).

Namely, the weight controlling unit 15 reduces the distance between the first feature and the second feature in the feature space when the predetermined parameter is 1. The weight controlling unit 15 increases the distance between the first feature and the second feature in the feature space when the predetermined parameter is 0.

For example, when the predetermined parameter is set by the user to be 1, the first feature and the second feature should be classified to be the same gesture event. When the predetermined parameter is set by the user to be 0, the first feature and the second feature should be classified to be two different gesture events.

Moreover, the user may further set the predetermined parameter to be 0, and the user may perform two different gestures. The weight controlling unit 15 may increase the distance between the first feature and the second feature in the feature space.

Figure 4:
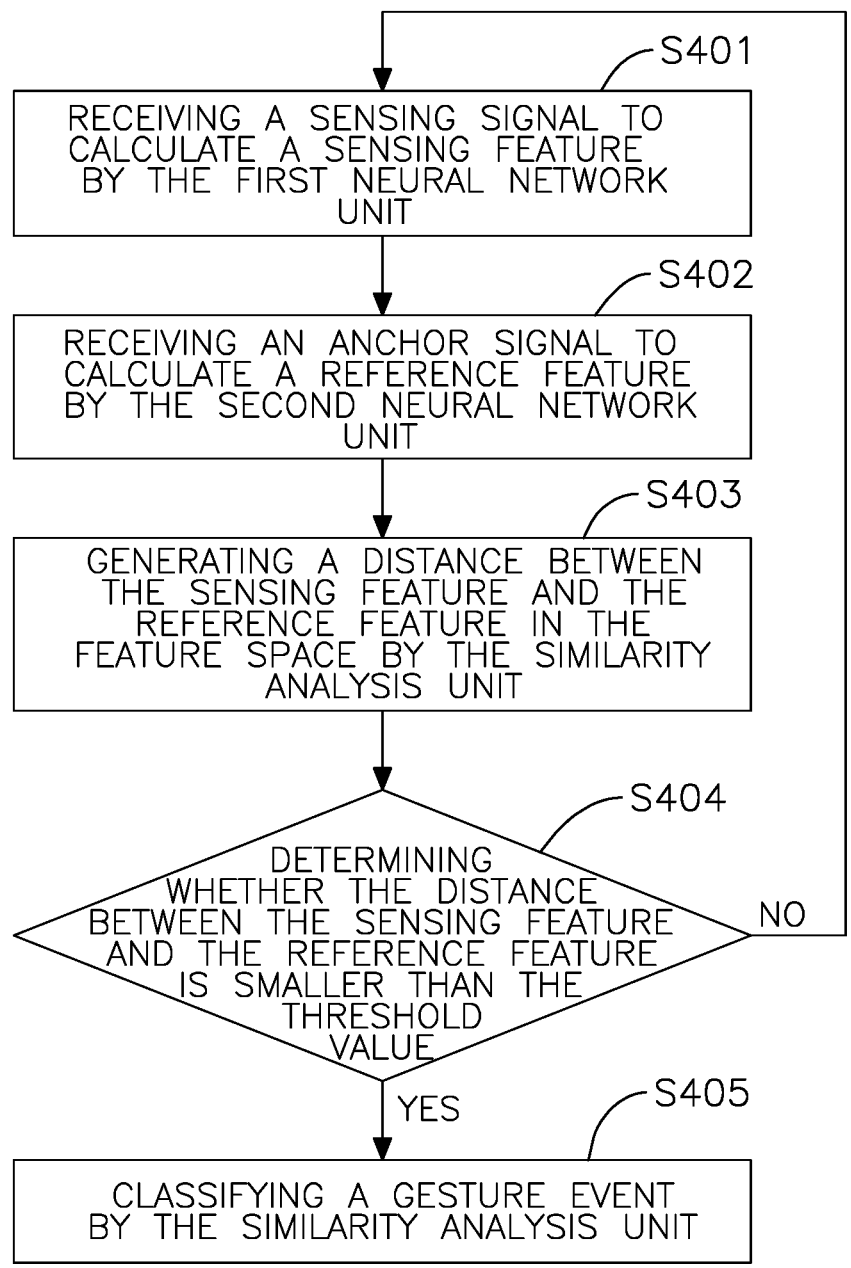
FIG. 4 is a flowchart of a third embodiment of the gesture recognition method using the siamese neural network of the present invention.

With reference to FIG. 4, the gesture recognition method further includes step of:

receiving a sensing signal from the sensor 10 to calculate a sensing feature by the first neural network unit 11 (S401);

receiving an anchor signal from a database to calculate a reference feature by the second neural network unit 12 (S402);

generating a distance between the sensing feature and the reference feature in the feature space by the similarity analysis unit 14 (S403);

determining whether the distance between the sensing feature and the reference feature is smaller than the threshold value (S404);

when the distance between the sensing feature and the reference feature is smaller than the threshold value, classifying a gesture event by the similarity analysis unit 14 (S405).

Figure 5:
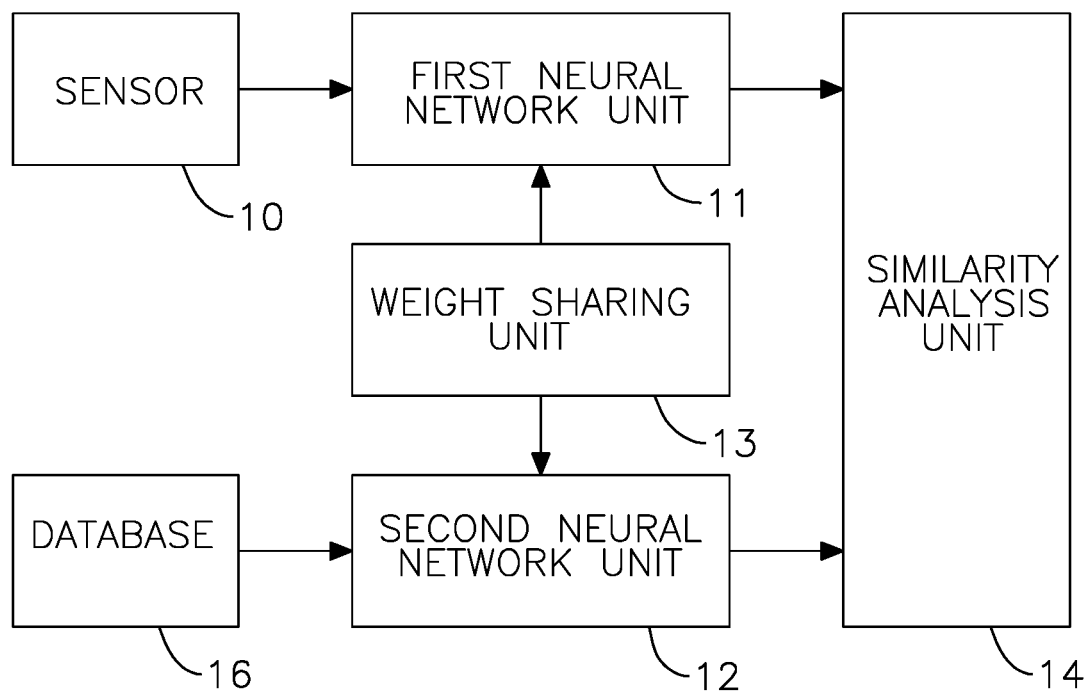
FIG. 5 is a block diagram of a second embodiment of the gesture recognition system using the siamese neural network of the present invention.

With reference to FIG. 5, the gesture recognition system further includes a database 16. The database 16 stores at least one anchor signal.

The first neural network unit 11 receives a sensing signal from the sensor 10 to calculate a sensing feature, and the second neural network unit 12 receives the anchor signal from the database 16 to calculate a reference feature.

The similarity analysis unit 14 further generates a distance between the sensing feature and the reference feature in the feature space. When the distance between the sensing feature and the reference feature is smaller than a threshold value, the similarity analysis 14 classifies the gesture event.

For example, when the user wants to use the present invention to classify the gesture event, the user may perform a gesture, and the sensor 10 may sense the gesture of the user to generate the sensing signal.

The similarity analysis unit 14 may calculate the distance between the sensing feature from the sensor 10 and the reference feature from the database 16 in the feature space to determine the gesture event.

When the distance between the sensing feature from the sensor 10 and the reference feature is greater than the threshold value, the distance between the sensing feature and the reference feature in the feature space is too long. Therefore, the gesture of the user cannot be classified.

However, when the distance between the sensing feature from the sensor 10 and the reference feature is smaller than the threshold value, the distance between the sensing feature and the reference feature in the feature space is short enough. Therefore, the gesture of the user can be classified, and the similarity analysis unit 14 classifies the gesture event.

In the above embodiments, the first neural network unit 11 and the second neural network unit 12 execute convolutional neural networks (CNNs) or recurrent neural networks (RNNs), the first training signal and the second training signal are Range Doppler Image (RDI) signals, and the distance determined by the similarity analysis unit 14 is calculated by a contrastive loss function.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A gesture recognition method using siamese neural network, comprising steps of:
   controlling weight of a first neural network unit and weight of a second neural network unit to be the same by a weight sharing unit;
   receiving a first training signal from a sensor to calculate a first feature by the first neural network unit;
   receiving a second training signal from the sensor to calculate a second feature by the second neural network unit;
   determining a distance between the first feature and the second feature in a feature space by a similarity analysis unit;
   controlling the weight of the first neural network unit and the weight of the second neural network unit through the weight sharing unit to adjust the distance between the first feature and the second feature in the feature space according to a predetermined parameter by a weight controlling unit;
   receiving a sensing signal to calculate a sensing feature by the first neural network unit;
   receiving an anchor signal to calculate a reference feature by the second neural network unit;
   generating a distance between the sensing feature and the reference feature in the feature space by the similarity analysis unit;
   when the distance between the sensing feature and the reference feature is smaller than a threshold value, the similarity analysis unit classifies a gesture event.

2. The gesture recognition method as claimed in claim 1, wherein the weight controlling unit reduces the distance between the first feature and the second feature in the feature space when the predetermined parameter is 1.

3. The gesture recognition method as claimed in claim 1, wherein the weight controlling unit increases the distance between the first feature and the second feature in the feature space when the predetermined parameter is 0.

4. The gesture recognition method as claimed in claim 1, wherein the first neural network unit and the second neural network unit execute convolutional neural networks (CNNs) or recurrent neural networks (RNNs).

5. The gesture recognition method as claimed in claim 1, wherein the first training signal and the second training signal are Range Doppler Image (RDI) signals.

6. The gesture recognition method as claimed in claim 1, wherein the distance generated by the similarity analysis unit is calculated by a contrastive loss function.

7. A gesture recognition system using siamese neural network, comprising:
   a sensor, sensing a first training signal and a second training signal;
   a first neural network unit, electrically connected to the sensor to receive the first training signal, and calculate a first feature;
   a second neural network unit, electrically connected to the sensor to receive the second training signal, and calculate a second feature;
   a weight sharing unit, electrically connected to the first neural network unit and the second neural network unit to control weight of the first neural network unit and weight of the second neural network unit to be the same;
   a similarity analysis unit, electrically connected to the first neural network unit and the second neural network unit to receive the first feature and the second feature; wherein the similarity analysis unit determines a distance between the first feature and the second feature in a feature space;
   a weight controlling unit, electrically connected to the similarity analysis unit and the weight sharing unit; wherein the weight controlling unit controls the weight of the first neural network unit and the weight of the second neural network unit through the weight sharing unit to adjust the distance between the first feature and the second feature in the feature space according to a predetermined parameter; wherein:
   the first neural network unit further receives a sensing signal to calculate a sensing feature;
   the second neural network unit further receives an anchor signal to calculate a reference feature;
   the similarity analysis unit further generates a distance between the sensing feature and the reference feature in the feature space;
   when the distance between the sensing feature and the reference feature is smaller than a threshold value, the similarity analysis unit classifies a gesture event.

8. The gesture recognition system as claimed in claim 7, wherein the weight controlling unit reduces the distance between the first feature and the second feature in the feature space when the predetermined parameter is 1.

9. The gesture recognition system as claimed in claim 7, wherein the weight controlling unit increases the distance between the first feature and the second feature in the feature space when the predetermined parameter is 0.

10. The gesture recognition system as claimed in claim 7, wherein the first neural network unit and the second neural network unit execute convolutional neural networks (CNNs) or recurrent neural networks (RNNs).

11. The gesture recognition system as claimed in claim 7, wherein the first training signal and the second training signal are Range Doppler Image (RDI) signals.

12. The gesture recognition system as claimed in claim 7, wherein the distance determined by the similarity analysis unit is calculated by a contrastive loss function.

* * * * *